United States Patent [19]
Robbins et al.

[11] Patent Number: 5,565,818
[45] Date of Patent: Oct. 15, 1996

[54] LASER TRIMMABLE INTEGRATED NOISE CIRCUIT

[76] Inventors: David F. Robbins, 8 Newport Dr., Westford, Mass. 01886; Robert J. DeLitta, 15 Davis Dr., Londonderry, N.H. 03053

[21] Appl. No.: 508,164

[22] Filed: Jul. 27, 1995

[51] Int. Cl.$^6$ ................................................. H03B 29/00
[52] U.S. Cl. ................................................. 331/78; 331/182
[58] Field of Search ................................. 331/78; 342/168

[56] References Cited

U.S. PATENT DOCUMENTS

| | | | |
|---|---|---|---|
| 3,600,703 | 8/1971 | Geissler | 331/78 |
| 3,675,148 | 7/1972 | Edwards | 331/78 |
| 3,967,187 | 6/1976 | Edwards | 323/304 |
| 5,331,217 | 7/1994 | Mellissinos | 327/100 |

OTHER PUBLICATIONS

Drexler, "Noise Measurement Using the Y Factor", RF Design, Oct. 1988, pp. 84, 85, 87–91.

Primary Examiner—Siegfried H. Grimm
Attorney, Agent, or Firm—Vernon C. Maine

[57] ABSTRACT

Method and apparatus for an integrated noise circuit for generating broadband gaussian noise with specified spectral flatness, matching impedance, and power output characteristics. A diode section operated in an avalanche breakdown mode is the primary noise source. A resistor network is selected to provide the specified matching impedance. Additional series resistor sections in the circuit are laser trimmed in production for specified spectral flatness and output power. The integrated noise circuit may be packaged for surface mounting on a printed circuit board.

8 Claims, 5 Drawing Sheets

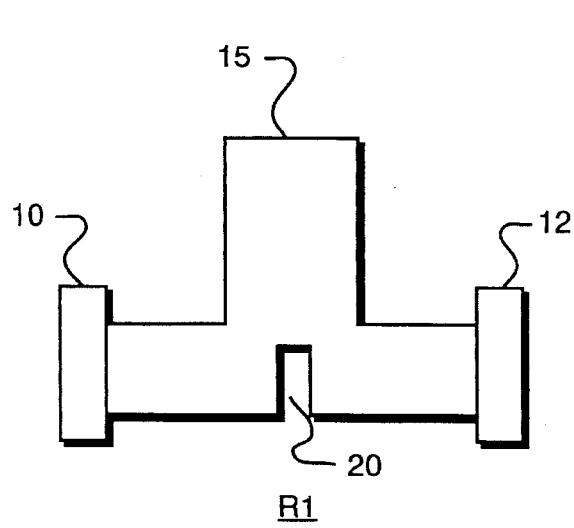
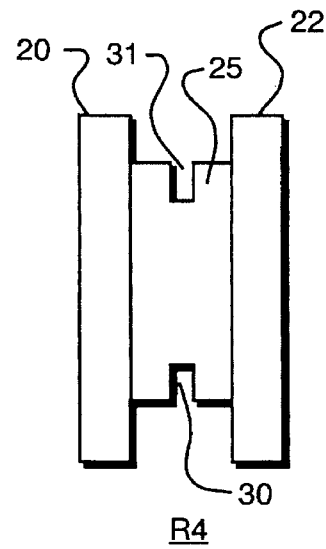
FIG. 5A  FIG. 5B
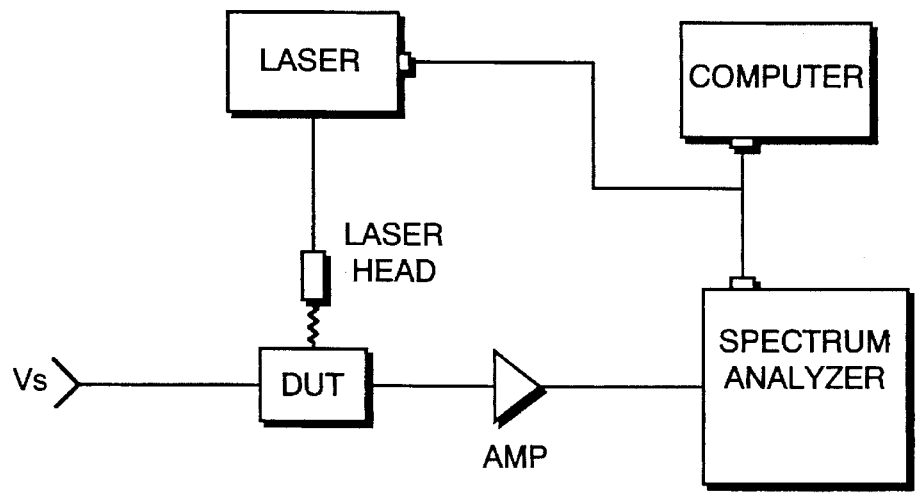
FIG. 6

LASER TRIMMABLE INTEGRATED NOISE CIRCUIT

BACKGROUND OF THE INVENTION

1. Technical Field of the Invention

The present invention relates to electronic circuits for generating random electromagnetic noise; more particularly to integrated circuits and devices that produce broadband electromagnetic noise output for testing, calibration, and other purposes.

2. Background Art

As is well known in the art, electrical noise is an inherent factor in electronic designs. The noise is generated by the random vibrations of conducting electrons and holes in the material. The existence of noise is primarily due to the fact that electrical charge is not continuous, but consists of discrete amounts of electric charge. Since noise is a random event, the instantaneous value of the waveform cannot be predicted at any time, but a gaussian distribution or average value can be computed.

In receivers, the amount of noise generated in a circuit determines the upper and lower limits of an input signal that can be carried without severe distortion. By connecting a noise source to a circuit and measuring the input and output noise levels, the amount of noise generated in the circuit can be determined and represented by commonly-used parameters such as noise figure, Y-factor, noise factor, or Signal-to-Noise Ratio.

Conventional noise generating devices are typically large and expensive devices that must be externally connected to the host device under test in order to make any sort of measurement.

Noise diodes are available, but these components generally do not have predictable and precise output power levels, and are specified without a tolerance level. They also typically do not contain a matched circuit on the output, and the matching network must be incorporated into the host device design.

Geissler's U.S. Pat. No. 3,600,703, Aug. 17, 1971 is a pioneer patent in the operation of diodes in the breakdown region for generating useful noise, and remains an instructive disclosure on the subject.

Solitron U.S. Pat. No. 3,967,187 is a noise diode with a current limiting design. The current limiting is accomplished by using a field effect transistor or FET. The operational characteristics of the FET serve to limit the supply current to the noise diode.

Solitron U.S. Pat. No. 3,675,148 is a noise diode with temperature stability and a matched network connected to the built-in amplifier. The matching is accomplished through the feedback circuitry of the amplifier.

Noise modules have been recently introduced to the market, but these lack close tolerance and precision in the output power levels, and are therefore typically not specified with a tolerance unit. These units are not well matched, and are not repeatable from unit-to-unit, due to the inherent difficulties of dealing with noise, and the limitations of current production methodologies. Noise modules are not fabricated as integrated circuits and not packaged as surface mount components.

SUMMARY OF THE INVENTION

One object of the present invention is to provide an integrated noise circuit with a specified spectral flatness, output power and output impedance.

Another object is to provide for production line adjustment of the noise output of an integrated noise circuit to achieve a specified spectral flatness.

Yet another object is to provide for production line adjustment of the power output of an integrated noise circuit to achieve a specified power output level.

Still yet another object is to provide an integrated noise circuit with a matching impedance section selected for a specified output impedance.

Even still yet another object of the invention is to provide an integrated noise circuit for surface mounting on a printed circuit board.

An additional object of the invention is to provide a method for producing an integrated noise circuit with a specified spectral flatness, output power and output impedance.

Another additional object is to provide a method for production line adjustment of an integrated noise circuit for a specified spectral flatness.

Yet another additional object is to provide a method for production line adjustment of an integrated noise circuit for a specified power output level.

The noise generated by the present invention encompasses a broadband frequency spectrum at a precisely quantified power output level of close tolerance. Because it has a known power output level, this parameter does not have to be determined by the host circuit in order to use the noise output effectively for measurements, but rather, can be assumed. Thus, the invention can be more easily used by the host device for frequency-related measurements including gain, flatness, and filter response. This facilitates self-test, calibration, built-in-test, fault isolation, and other host device applications that utilize broadband noise.

The present invention may be fabricated as an integrated circuit and incorporate a high performance noise diode section and a matching network section. It may be packaged as a surface mount product, making it small, inexpensive, low power, and easy to integrate into host circuit designs.

By driving the noise diode section into the avalanche region, excessive noise output is produced by the invention. While other sources of noise commonly inherent in any electronic circuit are technically included in the total noise output, these other categories of noise are negligible as compared to the noise output of a diode operated in this fashion, and do not alter the gaussian distribution of total power output to any discernible degree.

The avalanche breakdown occurs when the holes and electrons in the depletion region of a reverse-biased PN junction acquire sufficient energy to create hole-electron pairs by collisions with other silicon atoms. This process is cumulative, resulting in the production of a random series of large noise spikes. This is caused when a single carrier starts the avalanche process and results in the production of a current burst containing many carriers moving together. The total noise output is the sum of a number of random bursts of this type.

The instant invention enables this noise output to be readily manufactured as an integrated noise circuit, to user specifications of input voltage, spectral flatness, output impedance and output power level.

A combination of features make the instant invention novel to the industry. It is a complete noise source circuit, including a matching network section. It is fabricated as an integrated circuit and packaged as a surface mount unit.

The frequency response of the noise diode section is set in production to the user's specification of spectral flatness by laser trimming a thin film resistor in the power input side of the circuit. This changes the bias voltage on the diode section, and the characteristic of the noise output waveform.

The output noise power level is set in production to a very close tolerance by laser trimming a thin film resistor in the output section of the circuit, while providing a proper impedance match through a resistor network section. This circuitry and methodology assures a stable and precise frequency spectrum and output power level from unit-to-unit which can be simply integrated into host circuitry for various useful applications.

Still other objects and advantages of the present invention will become readily apparent to those skilled in this art from the following detailed description, wherein we have shown and described preferred and other embodiments of the invention, simply by way of illustration of the best mode contemplated by us on carrying out the invention. As will be realized, the invention is capable of other and different embodiments, and its several details are capable of modifications in various obvious respects, all without departing from the invention.

BRIEF DESCRIPTION OF THE FIGURES

FIGS. 5A and 5B are diagrams of the respective resistor sections for spectral flatness adjustment and output power adjustment of a preferred embodiment of the invention, illustrating where the laser trimming is applied to the respective resistor sections.

FIG. 6 is a block diagram illustrating the components of an automated laser trimming system used in production to adjust the value of the resistor sections of FIGS. 5A and 5B.

DESCRIPTION OF THE PREFERRED EMBODIMENT

Figure 1:
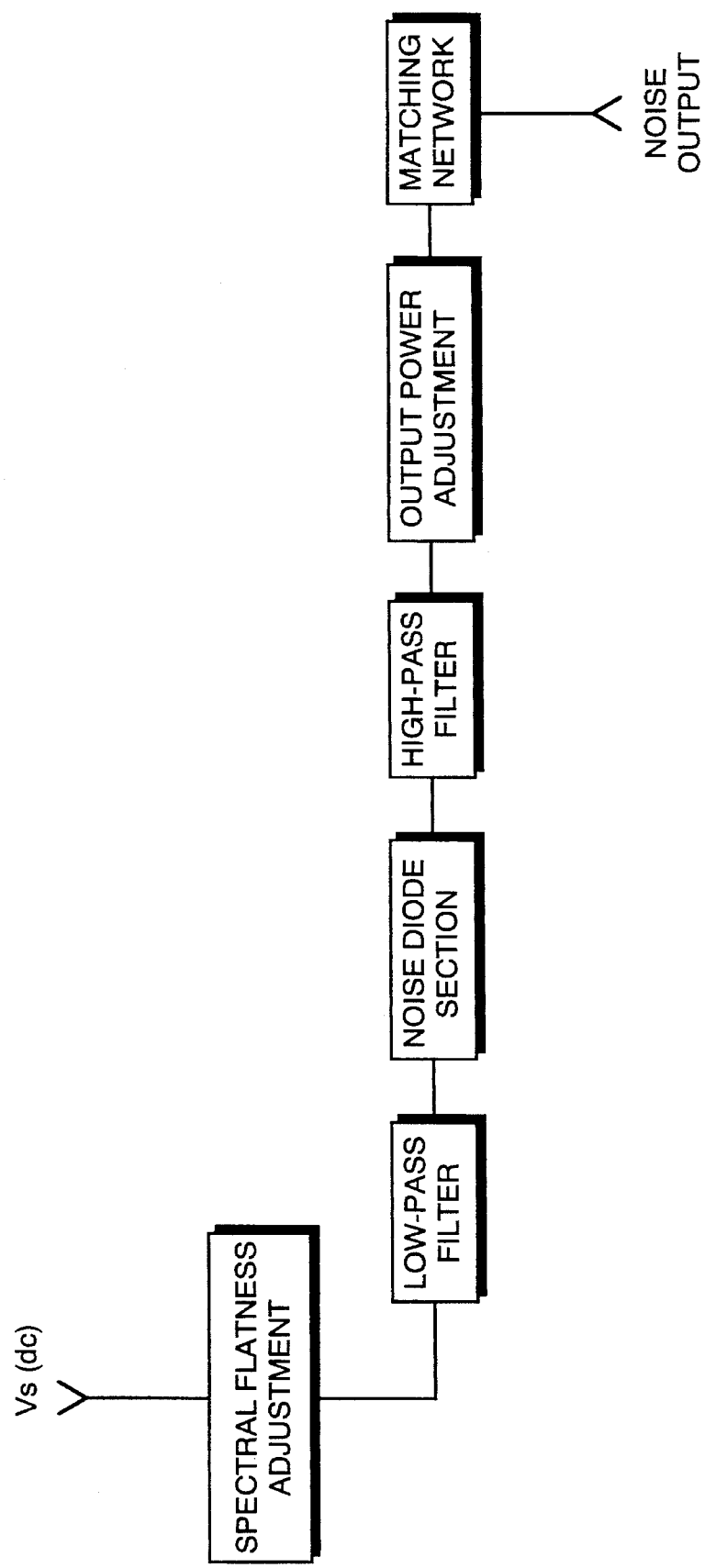
FIG. 1 is a functional block diagram of a preferred embodiment of the invention.

The invention in it's simplest form is an integrated noise circuit for surface mounting on a printed circuit board of a host device to provide an internal noise source of known characteristics.

The invention is capable of many and sundry embodiments, variations and applications. As an example, the invention can be incorporated within a host design or device for frequency-related measurements including gain, flatness, and filter response. This facilitates self-test, calibration, built-in-test, fault isolation, and other host device applications that utilize broadband noise.

As a further example, the invention may be in the form of integrated noise circuit for supplying electromagnetic broadband noise with a specified spectral flatness, with a diode section being operated with a reverse bias voltage in avalanche breakdown mode to generate the noise, and a laser trimmable thin film spectral flatness resistor section connected in series with the diode section so that the resistance of the resistor section can be increased by laser trimming to reduce the reverse bias voltage across the diode section until the specified spectral flatness is achieved.

As a yet further example, the invention may be in the form of an integrated noise circuit for supplying electromagnetic broadband noise at a specified output power and a specified output impedance, where the circuit includes a matching network sized to provide the specified output impedance, and a laser trimmable thin film output power resistor section connected in series with the matching network section so that the resistance of the output power resistor section can be increased by laser trimming to decrease the current flow in the output side of the circuit until the specified output power is achieved. The matching impedance is substantially unaffected by the change in the output power resistor section.

As a still yet further example, another embodiment of the invention may combine the features of specified spectral flatness with specified matching impedance and output power as described in the above paragraphs, where the matching network is sized as required, and spectral flatness and output power are achieved by laser trimming of respective resistor sections.

As an even still yet further example, any embodiment of the invention may be fabricated and configured for surface mounting on a printed circuit board of a host device, where it may provide enhancements or enable features or capabilities not otherwise available.

As an additional example, the invention may be practiced as a method for making an integrated noise circuit for supplying broadband electromagnetic noise with specified spectral flatness, where the circuit device is first fabricated so as to include a diode section being operated with a reverse bias voltage in avalanche breakdown mode to generate the noise, and a laser trimmable thin film spectral flatness resistor section connected in series with said diode section. Then the device is engaged in an automated laser trimming operation where the resistor section is trimmed for increasing resistance, which reduces the amount of reverse bias voltage and flattens the spectral output of the diode section while the circuit is monitored until the specified degree of spectral flatness is achieved.

As a further additional example, the invention may be practiced as a method for making an integrated noise circuit for supplying broadband electromagnetic noise with specified output power and specified output impedance, where the circuit is fabricated to include a noise source, a matching network for the specified output impedance, and a laser trimmable thin film output power resistor section connected in series with the matching network section. The circuit is then submitted to an automated laser trimming operation where the output power resistor section is trimmed for increasing resistance while the circuit is monitored until the specified output power is achieved.

As a still further additional example, the invention may be practiced by a method combining the steps of the above methods to yield a device with the features of specified spectral flatness with specified matching impedance and output power as described in the above paragraphs.

As a yet still further additional example, the circuit made by any method of the invention may be configured for surface mounting on a printed circuit board of a host device.

Figure 2:
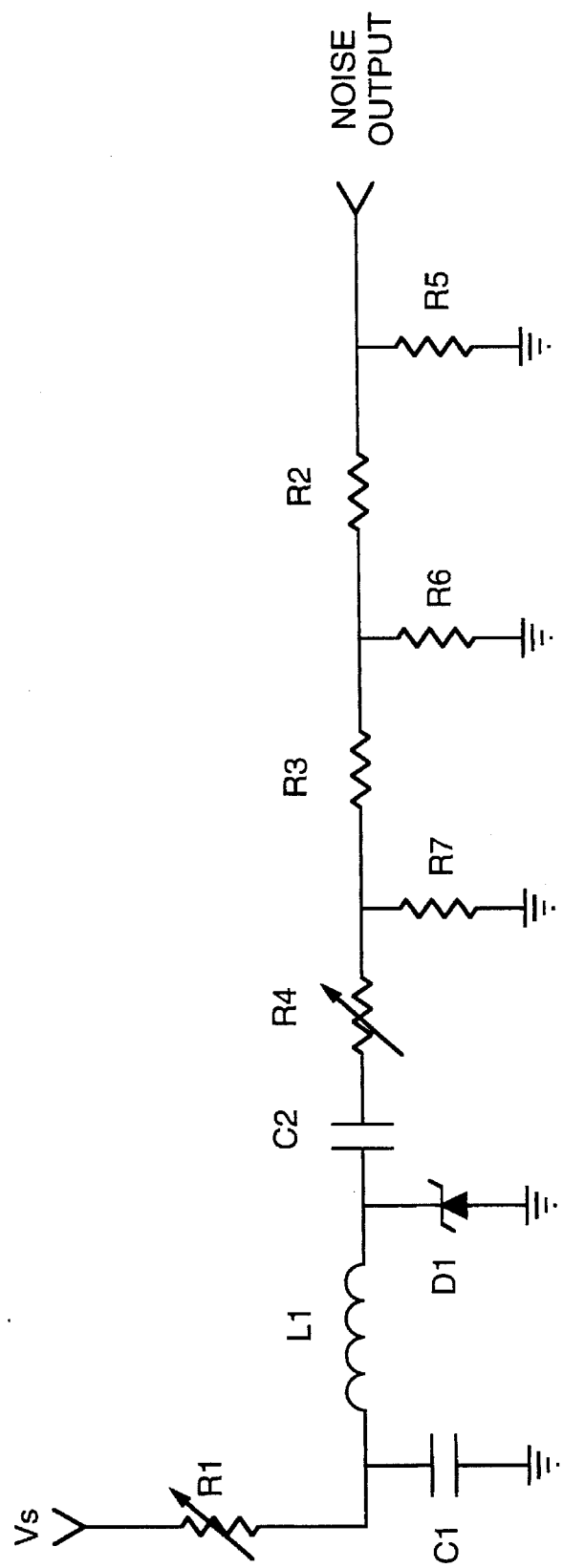
FIG. 2 is an electrical schematic of a preferred embodiment of the invention.

Referring generally to the figures, the integrated noise circuit of the preferred embodiment is configured as shown in the functional block diagram of FIG. 1 and the schematic of FIG. 2.

Figure 3:
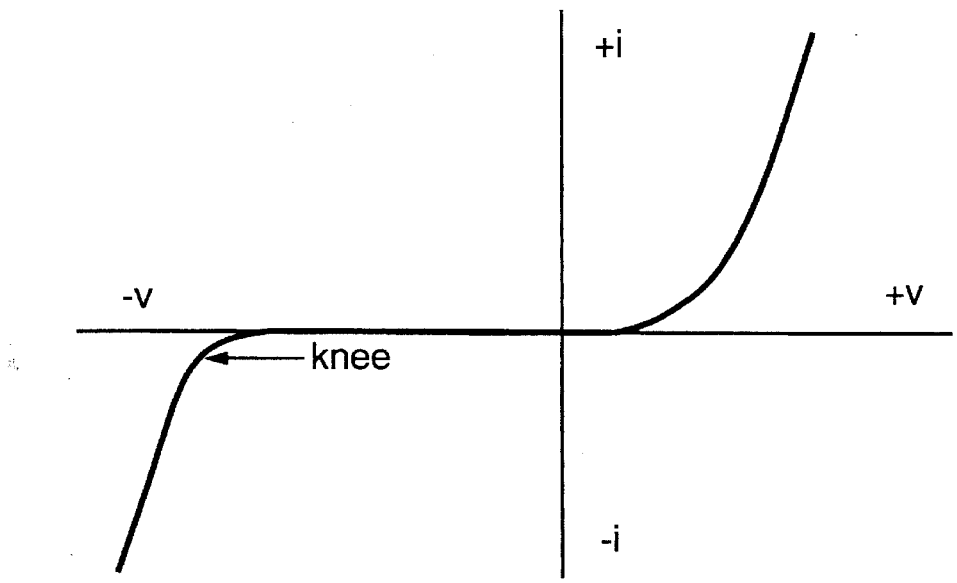
FIG. 3 is a graph which illustrates the current and voltage characteristics and normal operating region in avalanche breakdown mode of the noise diode section of the invention.

The user's intended external DC voltage source (Vs) operates the noise diode section of FIG. 1 in it's avalanche breakdown region or mode, at or near the knee of the curve as indicated in FIG. 3, thereby generating the raw noise signal.

Figure 4:
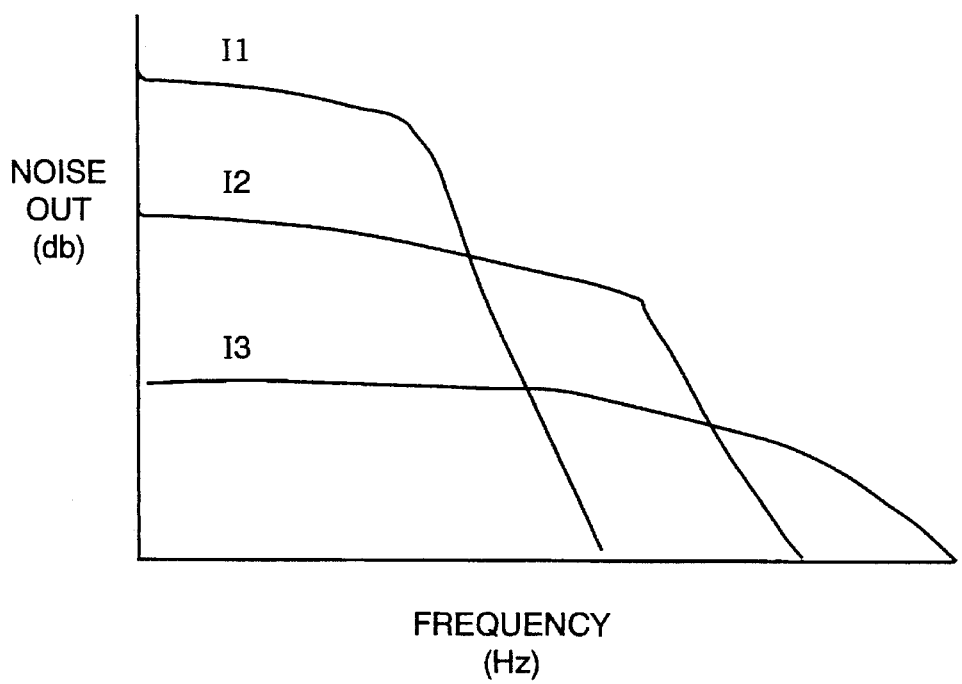
FIG. 4 is a graph of output noise power versus frequency which illustrates the spectral flatness of the output noise of the invention for three current levels.

A laser trimming process provides the means to move the operating point of the noise diode section through the "knee" region of the current versus voltage operating graph of FIG. 3 to achieve the customer's desired spectral flatness in the frequency band output of the circuit, as indicated in the power versus frequency response graph of FIG. 4.

The matching network section of FIG. 1 is configured to provide the customer's desired output impedance, while the laser trimming process provides the means to adjust the output level adjustment section to the customer's specification.

Low-pass and high-pass filter sections of FIG. 1 on respective sides of the diode section provide the necessary isolation of DC supply and noise output.

FIGS. 5A and 5B are map views of the actual spectral flatness adjustment and output level adjustment resistor sections of FIG. 1, illustrating where and with what orientation the automated laser trimming is applied to make the necessary adjustments.

FIG. 6 is a block diagram illustrating the components of the automated laser trimming setup used in production to adjust the value of the resistor sections of the integrated noise circuit or DUT (Device Under Test).

Figure 7:
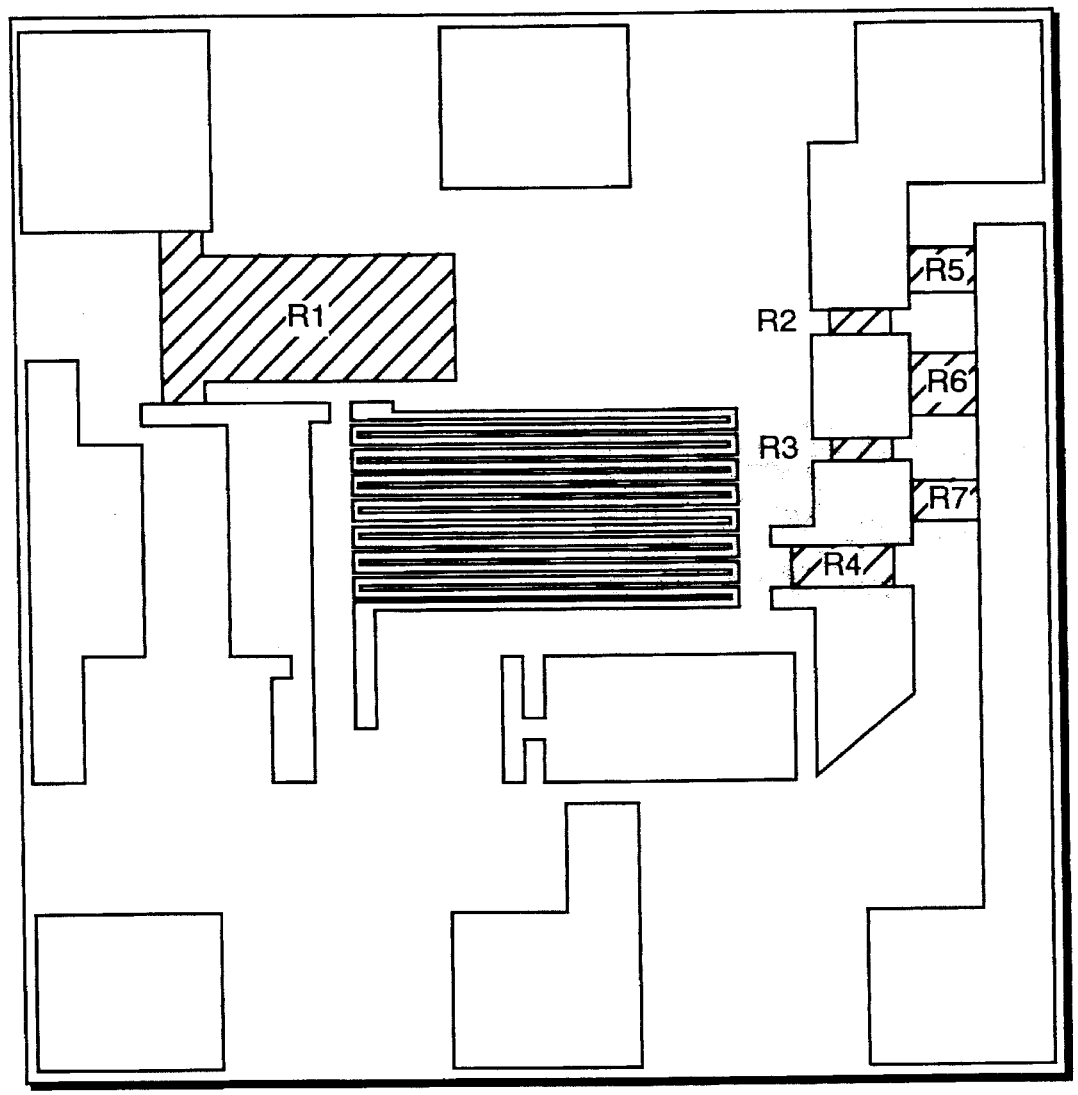
FIG. 7 is a map view of the printed circuit board of a preferred embodiment showing the layout of the functional sections.

FIG. 7 is a map view of the printed circuit board of a preferred embodiment showing the functional sections depicted in FIGS. 1 and 2.

Referring again to FIGS. 1 and 2, the low pass filter section of FIG. 1 consists of capacitor C1 and choke L1 of FIG. 2, and functions to remove ripple from the DC voltage input and prevents the noise diode section output from interfering with the voltage source. The DC voltage is then applied to the integrated circuit noise diode D1 at a level needed to induce the avalanche breakdown beyond the knee of the curve in FIG. 3, thereby generating noise in the circuit.

The spectral flatness adjustment of FIG. 1 of the circuit is accomplished by laser trimming current limiting resistor R1 of FIGS. 2 and 5A to increase the resistance so as to produce the optimum input current level, in order to obtain an acceptably uniform flatness of the noise output over the desired spectral or frequency range, as illustrated in FIG. 4.

The high pass filter section of FIG. 1 consists of capacitor C2 of FIG. 2, and functions to block DC and lower frequencies from interfering with the desired noise output.

The output impedance matching network section of FIG. 1 consists of resistors R2, R3, R5, R6, and R7 in the conventional dual pi network of FIG. 2, and provides approximately 14 dB of return loss with a 50 ohm match to the output.

The output power level is adjusted with the output level adjustment of FIG. 1 and is precisely set by laser trimming resistor R4 of FIGS. 2 and 5B. By gradually increasing the resistance of resistor R4, the desired output level can be achieved within a very tight tolerance. A typical value of adjusted output level is 31 dB.

By way of further explanation of the method of frequency range selection, the integrated noise circuit is first fabricated with resistor section R1 having a sufficiently small value to assure that the noise diode section D1 would operate well into it's avalanche breakdown region; in the lower left quadrant of the graph of FIG. 3. With the noise circuit under test as shown in FIG. 6, resistor section R1 is then laser trimmed to increase resistance, thereby decreasing the negative voltage across noise diode section D1, the diode section still operating within it's avalanche region, thereby shifting the frequency range to provide acceptable spectral flatness or uniformity of output in the desired frequency range, as illustrated by the curves of the graph of FIG. 4.

By way of further explanation of the methodology of the resistor sections and the laser trimming technique, the thin film resistive material is laid out to provide a minimum resistance consistent with the circuit design, and so as to be susceptible to automated laser cutting of slots into the edge of the material while the device is under test, perpendicular to the current flow, so as to decrease the conductivity of the pathway at a measurable rate as reflected in the change to the respective parameter being monitored.

The trimming process for resistor sections R1 and R4 is illustrated in FIGS. 5A and 5B respectively. The methodology of the invention calls for resistor section R1 to be trimmed for desired frequency response. This is accomplished by the interactive process of making laser cut 20 in resistive material 15 in the orientation shown, while monitoring the spectral flatness of the output. This cut increases the resistance of the resistor section connected between metal trace 10 and metal trace 12 or resistor section R1. The deeper the incision, the greater the resistance.

By increasing the resistance, the current flowing through this portion of the circuit is reduced, thereby decreasing the current available to the noise diode section. As illustrated in FIG. 4, the output frequency response of the noise diode section varies as a function of the input current, providing the feedback to indicate when to stop the trimming process.

Resistor section R4 is similarly trimmed as indicated by FIG. 5B to obtain the desired output level. The laser is used to make cuts 30 & 31 on resistive material 25 that is between metal trace 20 and metal trace 22. These cuts increase the resistance between the two metal traces. The increase of the resistance decreases the current output which thereby decreases the overall output level of power of the circuit to the user's specification. By trimming the resistor section R4 between 5 and 65 ohms, the output power can be adjusted by about 4 dB.

The objects and advantages of the invention may be further realized and attained by means of the instrumentalities and combinations particularly pointed out in the appended claims. Accordingly, the drawings and description are to be regarded as illustrative in nature, and not as restrictive.

We claim:

1. An integrated noise circuit for supplying electromagnetic broadband noise with a specified spectral flatness, said circuit comprising means for generating said noise, said means comprising a diode section being operated with a reverse bias voltage in avalanche breakdown mode, said circuit further comprising means for setting said spectral flatness of said noise, said means comprising a laser trimmable thin film spectral flatness resistor section connected in series with said diode section whereby resistance of said spectral flatness resistor section is increasable by laser trimming to reduce said reverse bias voltage across said diode section until said specified spectral flatness is achieved.

2. An integrated noise circuit for supplying electromagnetic broadband noise at a specified output power and a specified output impedance, said circuit comprising:

means for generating said noise, a matching network of said specified output impedance, and means for setting output power;

said means for setting said output power comprising a laser trimmable thin film output power resistor section connected in series with said matching network, resistance of said output power resistor section being increasable by laser trimming to decrease current flow until said specified output power is achieved.

3. The integrated noise circuit of claim 1, said circuit further supplying said noise at a specified output power and a specified output impedance, said circuit further comprising a matching network of said specified output impedance and means for setting said output power, said means for setting said output power comprising a laser trimmable thin film output power resistor section connected in series with said matching network, resistance of said output power resistor section being increasable by laser trimming until said specified output power is achieved.

4. The integrated noise circuit of claim 3, further comprising said circuit being configured for surface mounting on a printed circuit board of a host device.

5. A method for making an integrated noise circuit for supplying broadband electromagnetic noise with specified spectral flatness, said method comprising the steps of:

fabricating said circuit comprising means for generating said noise and means for setting said spectral flatness of said noise, said means for generating said noise comprising a diode section being operated with a reverse bias voltage in avalanche breakdown mode, said means for setting said spectral flatness comprising a laser trimmable thin film spectral flatness resistor section connected in series with said diode section, and laser trimming said spectral flatness resistor section for increasing resistance while monitoring said circuit until said specified spectral flatness is achieved.

6. A method for making an integrated noise circuit for supplying broadband electromagnetic noise with specified output power and specified output impedance, said method comprising the steps of:

fabricating said circuit comprising means for generating said noise, a matching network of said specified output impedance, and means for setting output power, said means for setting said output power comprising a laser trimmable thin film output power resistor section connected in series with said matching network, and laser trimming said output power resistor section for increasing resistance while monitoring said circuit until said specified output power is achieved.

7. The method of claim 5, said circuit further supplying broadband electromagnetic noise with specified output power and specified output impedance, said fabricating of said circuit further comprising a matching network of said specified output impedance and means for setting said output power, said means for setting said output power comprising a laser trimmable thin film output power resistor section connected in series with said matching network, said method comprising the additional step of:

laser trimming said output power resistor section for increasing resistance while monitoring said circuit until said specified output power is achieved.

8. The method of claim 7, said circuit being configured for surface mounting on a printed circuit board of a host device.

\* \* \* \* \*